United States Patent [19]

Plummer et al.

[11] Patent Number: 4,480,975

[45] Date of Patent: Nov. 6, 1984

[54] APPARATUS FOR ENCAPSULATING ELECTRONIC COMPONENTS

[75] Inventors: Lawrence L. Plummer, Collegeville, Pa.; Kenneth Mikle, Marlton, N.J.

[73] Assignee: Kras Corporation, Fairless Hills, Pa.

[21] Appl. No.: 452,669

[22] Filed: Dec. 20, 1982

Related U.S. Application Data

[63] Continuation of Ser. No. 279,494, Jul. 1, 1981, abandoned.

[51] Int. Cl.³ .............................................. B29D 3/00
[52] U.S. Cl. .................................... 425/116; 249/134; 264/272.17; 264/276; 425/121; 425/411; 425/544
[58] Field of Search ............... 425/116, 121, 411, 543, 425/544; 249/83, 95, 134; 264/272.17, 276, 337; 29/588

[56] References Cited

U.S. PATENT DOCUMENTS

| 3,650,648 | 3/1972 | Lambrecht | 425/129 |
| 3,659,997 | 5/1972 | Rees | 425/589 |
| 3,663,145 | 5/1972 | Teraoka | 425/588 |
| 3,806,079 | 4/1974 | Beattie | 249/134 |
| 4,025,268 | 5/1977 | Taylor | 425/411 |
| 4,044,984 | 8/1977 | Shimizer et al. | 249/83 |
| 4,314,960 | 2/1982 | Hass | 264/276 |
| 4,332,537 | 1/1982 | Slepcevic | 425/121 |
| 4,374,080 | 2/1983 | Schroeder | 264/272.17 |

Primary Examiner—James Lowe
Attorney, Agent, or Firm—Eugene Chovanes

[57] ABSTRACT

Apparatus for encapsulating electronic components in plastic includes a press with upper and lower press members, upper and lower flat plastic carrier plates, and transfer injection means. The plates form a closed cavity and support the electronic component.

13 Claims, 18 Drawing Figures

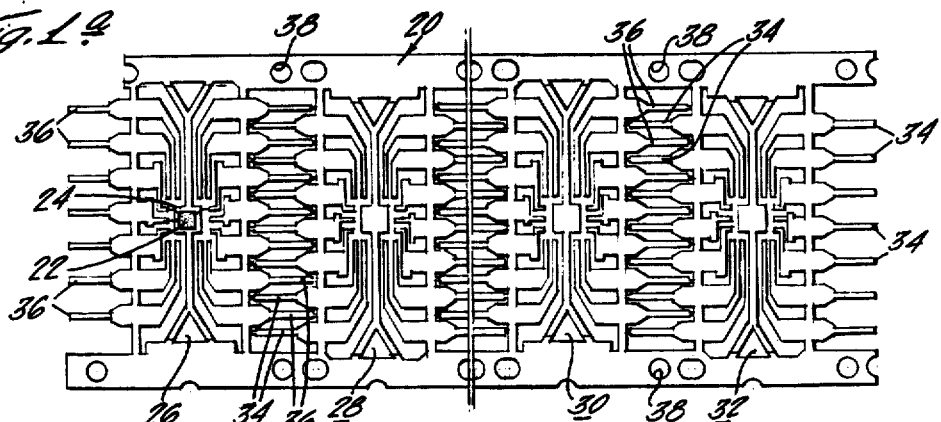
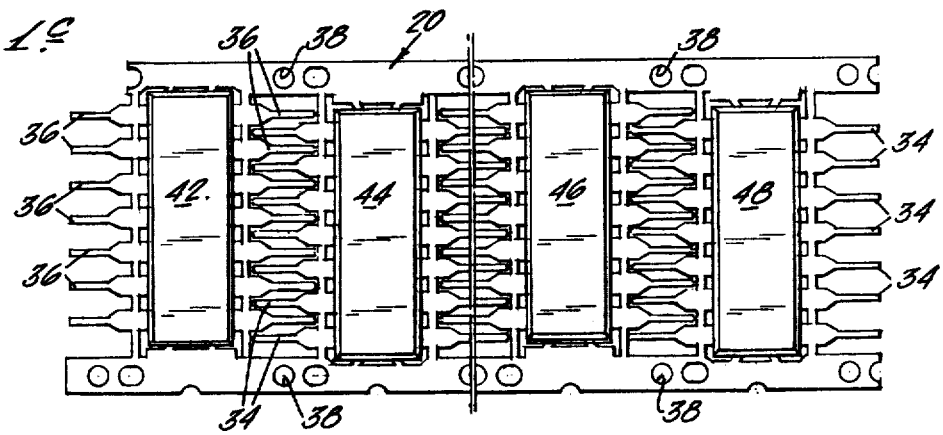
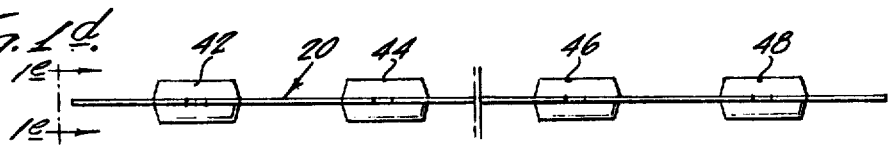
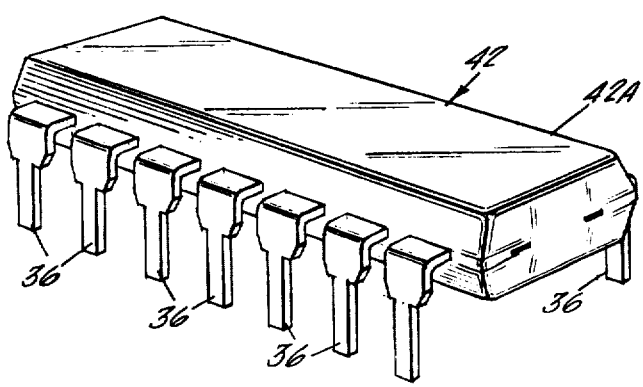

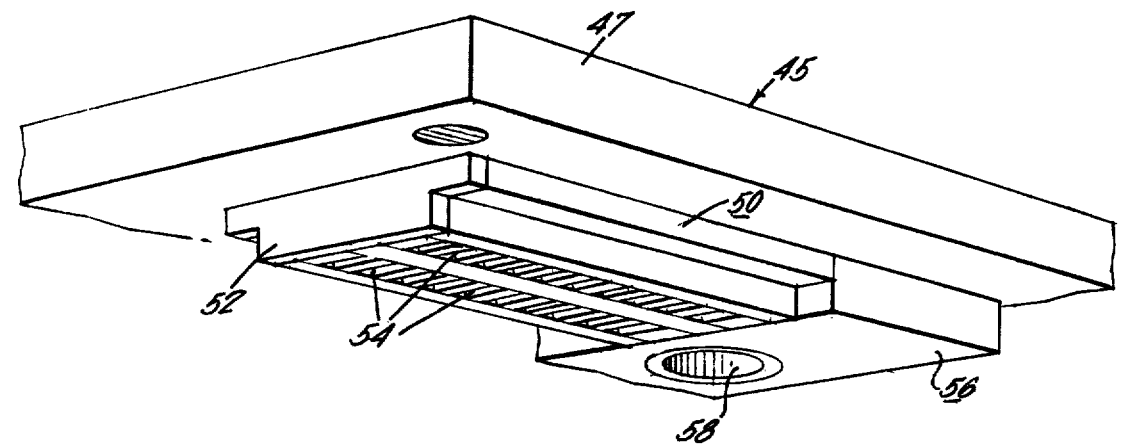
Fig. 3. (PRIOR ART)
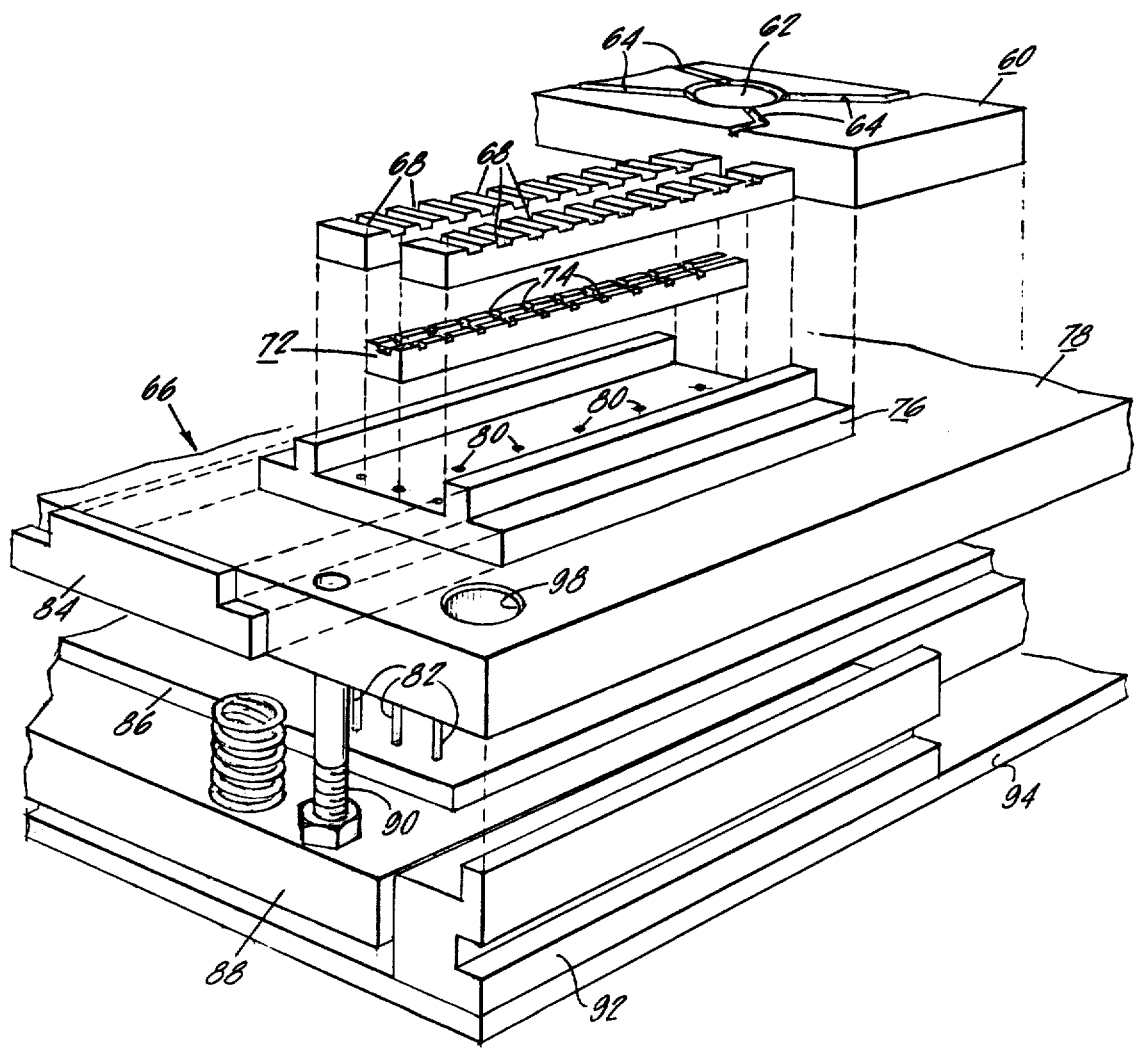

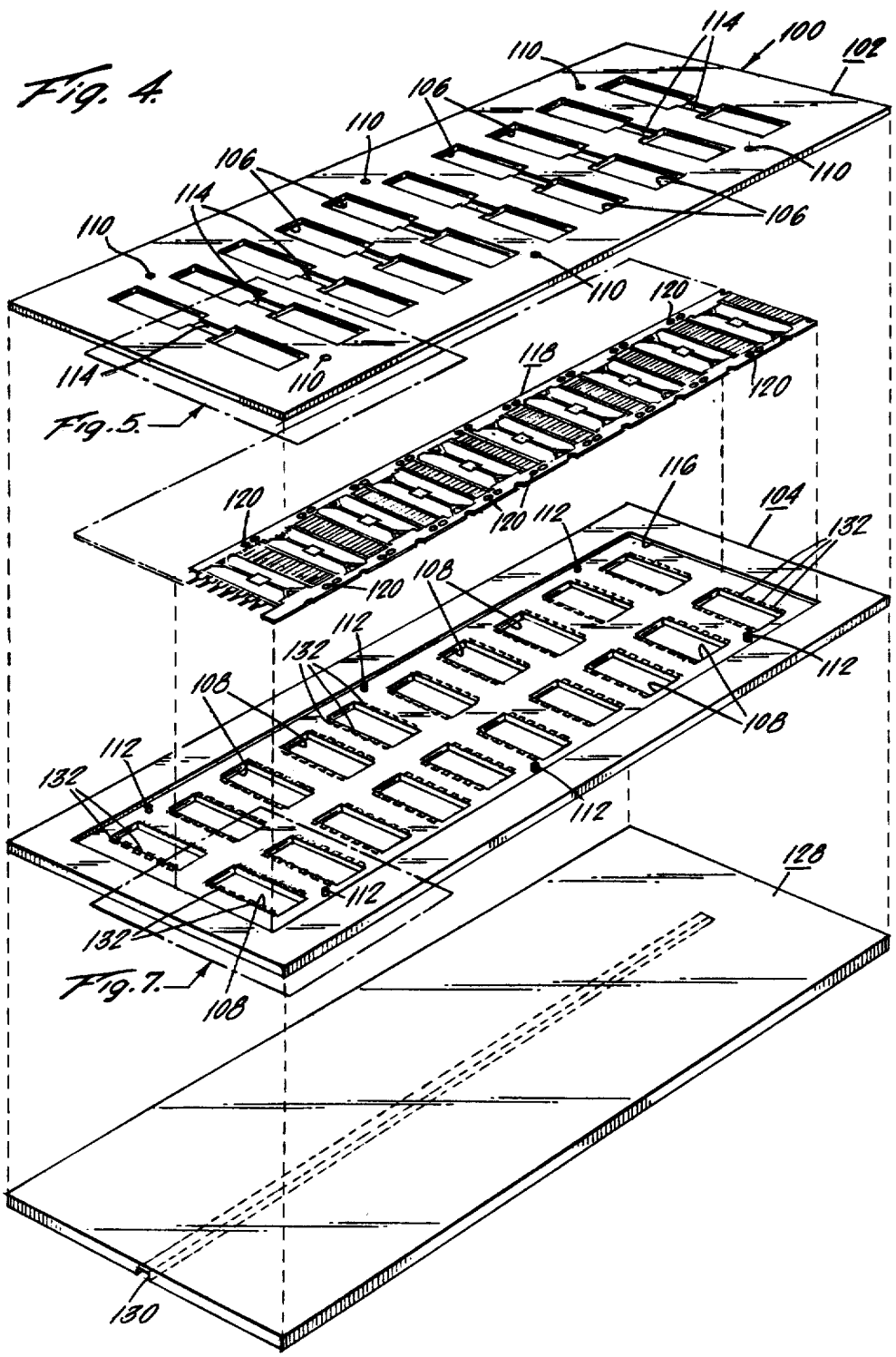

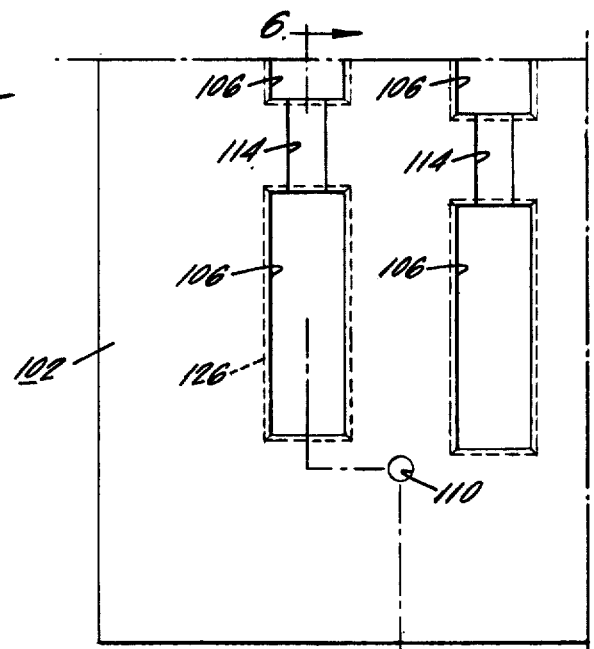
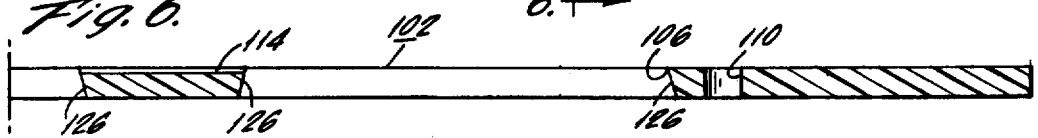
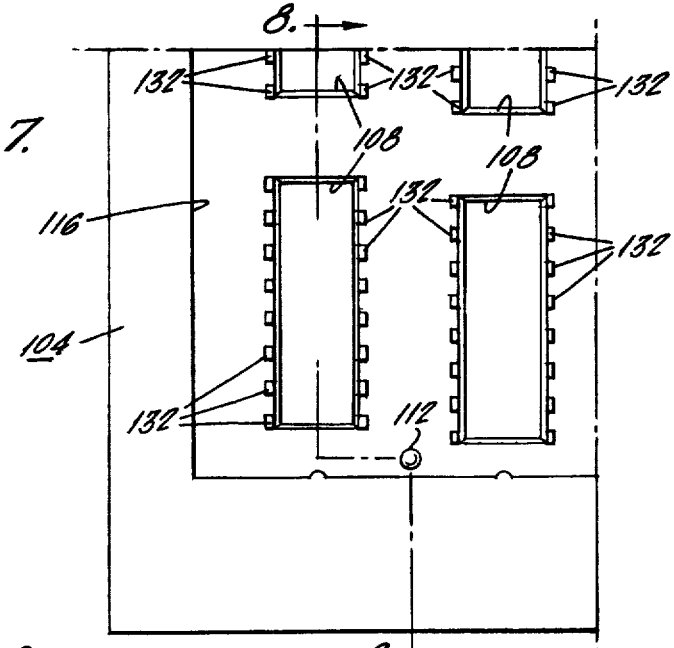
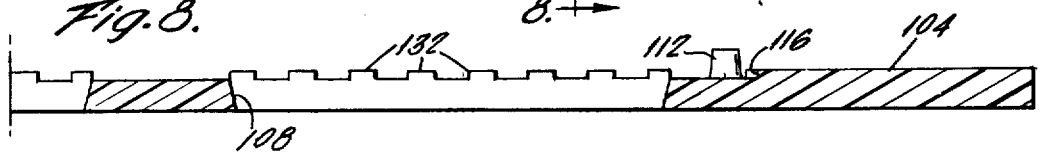

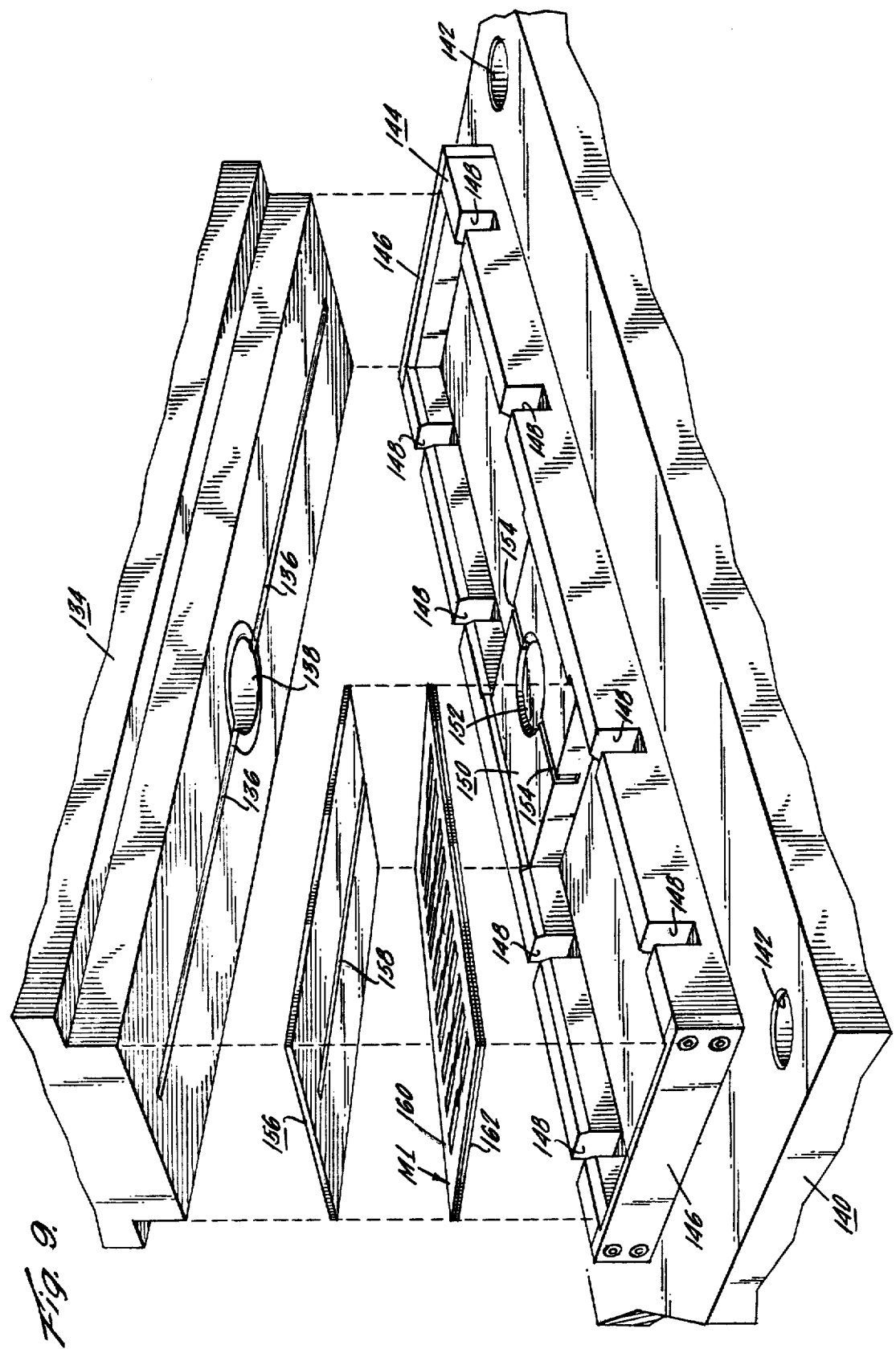

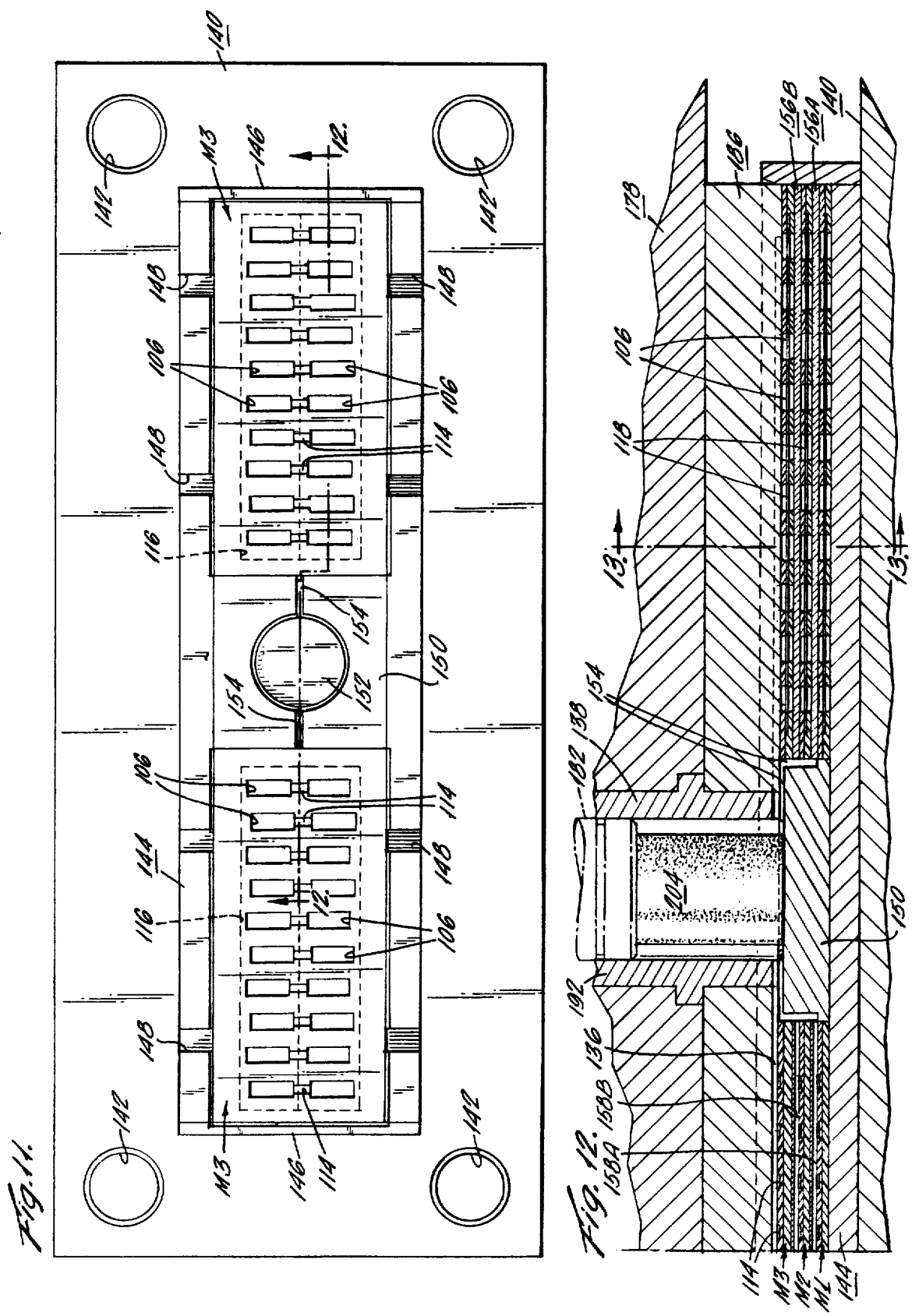

APPARATUS FOR ENCAPSULATING ELECTRONIC COMPONENTS

This application is a continuation of application Ser. No. 279,494, filed July 1, 1981 and now abandoned.

BACKGROUND OF THE INVENTION

The present invention relates broadly to the protection of electronic and electric components by encapsulation in plastic.

Electronic devices encapsulated in plastic are produced and used in the electronics industry in vast quantities. Such devices include, for instance, integrated circuits, transistors, resistors and diodes. They are produced in complex molding presses having precision molds and auxiliary loading equipment. The molds particularly are extremely complex. They are of metal and, to produce, require an extreme amount of labor by highly skilled workers. The molds have cavities therein for producing a multiplicity of encapsulated devices per press operation. To increase the number of devices produced, the molds must be made bigger, requiring bigger presses. The end result is that the production of encapsulated devices has become most costly because of the encapsulating step.

In the prior art, encapsulated electronic components, known as integrated circuit packages, or "IC's", are produced in great quantities. These can be for instance resistors, capacitors, or any other of many electronic devices. The encapsulating material is generally a thermo-setting material, such as epoxy or silicone.

The molds which are used to encapsulate these devices have been of metal. In order to withstand the high temperatures and molding pressure, these metal molds have been refined and highly developed to the present state of the art. Such molds are highly accurate, extremely strong, and extremely expensive. They do the job well but nevertheless have certain shortcomings.

A first shortcoming is that these metal molds are extremely expensive to produce, requiring many man-hours of skilled labor.

Another shortcoming is resin bleed, either caused by inaccuracies in the mold or from the product lead frame. In other words, the metal mold being extremely rigid will not compensate for discrepancies in the lead frame thickness and variations. Additionally, unless the metal mold is extremely precise in makeup, imperfect mating surfaces permit resin bleed. Thus, the finished encapsulated product has undesired plastic flashing or protuberances.

Another shortcoming in the metal molds is that to eliminate flash in certain areas, prohibitively expensive or impossible machining is necessary. Hence, the finished encapsulated product normally has flashing between the encapsulation and leads which must be subsequently removed.

All efforts to improve, and there have been many, encapsulation of IC's have been directed toward the improvement of metal molds.

Encapsulation systems usually consist of a molding press, a precision mold, and loading frames. The frames support the bare unencapsulated parts and carry such parts into the mold. Such machinery is extremely complex.

The components are encapsulated in a plastic, such as epoxy, silicone, polyester, alkyd or other materials. Such encapsulation involves a long-existing production problem. Evolution of concepts and equipment for protecting components has been a steady development, and particularly as regards delicate and fragile components such as integrated circuits, hereinafter referred to as "IC's".

As techniques and improvements have evolved over the years, materials of recent use in processes for encapsulating electronic components and the like, by the transfer molding process, have included epoxy molding compounds and silicone molding compounds.

Some of the characteristics of the molding materials used to protect delicate IC's, as presently envisaged, permit higher temperature operation and they are self-extinguishing or non-burning. The materials must be dimensionally accurate, chemically clean and inert. Care must also be taken to ensure that the molding compounds contain very few chemicals which can attack and corrode the subassembly of a semiconductor.

Materials used for encapsulation include epoxy and silicone molding compounds. Prior art methods of molding include compression molding, transfer molding and injection molding. Transfer molding, however, is the predominant process, and epoxies and silicones are the main molding compounds used. Products molded include, for example, coils and relays; capacitors and resistors with round wires or lead frames; and devices on metal stamped lead frames. Of increasing use are devices produced on metal lead frames. Basically, the process for an IC is to bond the IC "chip" onto a platform by gluing with a conductive material or by forming a eutectic bond of gold/silicon. The pads on the chip are attached to leads on fingers by very fine wires, for example gold or aluminum wires, as small as 0.001" (⅛ of a human hair in diameter), or smaller. The device must now be protected and provided with an appropriate shape, strength and identity.

Typical electronic component subassemblies consist of multiple connections of fine, delicate wires. The encapsulation techniques must allow a molding compound to enter a molding cavity, within which the electronic component is placed, from a runner, in a liquid form with close control of speed, pressure and viscosity, so as to eliminate damage to these delicate wires. To do this, the molding compound must, among other things, move easily from a solid to a thin liquid. The process must be controlled to create correct pressures, velocity and viscosities. The end result must be an encapsulation of the device in a solid, void-free package, without breaking or damaging the wires or the device itself.

In transfer molding, the molding compound, in powder, preform or preheated preform, is placed in an area of a closed mold called a "transfer pot." An auxiliary ram, or plunger, applies pressure to the surface of the molding compound, causing it to compact, soften and liquify. The heat and pressure cause this liquification. Continued pressure causes the liquid plastic to flow from the pot down a series of runners and into a cavity through a restriction known in the art as a gate. When the molding material fills the cavity, having surrounded the part to be encapsulated, the molding compound "cures" or hardens. Normally, such a process requires 1 to 3 minutes. In semiautomatic processes, as currently in use, the molding press opens, the parts, runners and any material remaining in the pot area are ejected by built-in ejector pins. The "shot" is removed, cull and runner separated, and discarded. The existing technique most widely used for electronic component encapsulation as mentioned above, is transfer molding.

In transfer molding technique, a molding press is used to contain the top and bottom parts of a mold which, typically, has numerous component cavities, and is used to transfer the molding material into the mold cavities. The press applies basically two forces. One force is used to clamp or keep the two halves of the mold closed. Presses can range in tonnage from 5 to 300 tons or more, with normal encapsulation range being approximately 10 to 200 tons, and second enormous forces applied to an auxiliary ram, or transfer ram to transfer the molding material into the mold cavities. An unprotected electronic component, which is positioned over a cavity in the bottom half of an open mold, can be readily damaged in the absence of proper apparatus. Subsequent to this placement, the press and mold halves are closed and the mold is heated within a range of approximately 300°–400° F. The molding compound is introduced, either as a powder or in a compacted shape called a preform which is a pre-measured amount. The preform is often preheated by means of an external, high frequency induction preheater. The compound, or preform, is positioned in a receptacle called a "transfer pot." The pot bottom, in operation, opens to a series of streets, channels or runners that lead to gates or openings in the cavity. The cavity defined by the top and bottom mold halves determines the final molded shape of the finished product. Subsequent to introduction in the transfer pot, the compound is compressed by the transfer ram. The extreme high pressure and heat of the mold causes the mold material to soften and melt, so that the liquid flows down the runner into the cavity, surrounds the component to be encapsulated and, because of the chemical makeup of the compound, it being a thermo set, undergoes an irreversible chemical process. The compound cures or polymerizes. The cycle time normally takes 1 to 3 minutes with currently available materials. Upon completion of the cure, the transfer ram retracts from the mold, the press and mold halves open, and the molded product, complete with runner and sprue, are removed, frequently with the assist of internal ejector pins or mechanisms.

Normally, the underside of the mold top and the topside of the mold bottom are then brushed and cleaned with an air blast to remove residual plastic or flash before placing new devices in the mold for encapsulation, following which the cycle is repeated.

As will be apparent, the molds used are extremely complex, very precise, expensive and difficult of construction, with formulation and delivery involving a substantial length of time.

The technology of encapsulation by transfer molding is ever expanding and developing. At the same time, the encapsulation molds are developing. Molds are known today which will encapsulate, for example, 120 14-lead IC's. Such molds must incorporate extreme accuracy to ensure accuracy in the final molded package, and additionally the mold must seal off the lead frame in a manner to prevent damage to the frame and leads while preventing undesired molding compound seepage. The molds must be built to extremely close tolerances. The metal of the molds must additionally be of very high hardness to prevent the compressive force of the press from damaging the mold's surface.

The current molds in use, such as a 120 cavity mold for a typical 14-lead IC, can require in excess of 1000 man hours to build by highly skilled tool and die makers. A typical 120 cavity IC mold has an extremely high selling price in view of the complexity and time involved in creation of the molds. There is a continued trend to use molds having greater capacities and, accordingly, a greater number of cavities. Under the present existing cost factors involved, a mold of 400 cavity capacity could cost in excess of $100,000.

In light of the foregoing background and history regarding development of micro-electronics, and the encapsulation of electric and electronic components within plastic, the ever-increasing mold costs and complexity are of extremely great significance. More and more types and numbers of parts and units are in demand.

The present invention is directed to a very substantial contribution to overcome these ever-increasing problems and, to this end, a new system, process and apparatus are taught. The invention results in a very substantial reduction in mold and molding costs, utilizes less molding compounds, reduces mold complexity, reduces delivery times for the equipment and increases the productivity of the transfer molding process in general.

Summary of the Present Invention

The present invention does away with metal molds in the encapsulation of IC's. Instead, molded, inexpensive plastic plates having cavities formed therein are used. Such plates are formed of specific thermoplastics having a melting point above the melting point of the encapsulated material, namely above 350° F. In contrast to the teachings of the prior art wherein rigid metallic plates were deemed necessary to accept and mold the high temperature encapsulating material, the present invention leads away from strength and rigidity of the mold and uses instead flexibility and compressibility of plastic mold plates. Furthermore, the present invention stresses disposability with the present plastic mold plates as opposed to the durability of the prior art metal plates.

Comparing the almost insignificant cost of producing the present plastic disposable, almost throwaway, plates to the extremely high cost of the rigid, durable prior art metal molds, the cost per encapsulation of the plastic plates compared to the cost per encapsulation by use of the metallic plates is extremely favorable to the plastic plates.

The plastic plates of the present invention are made from a master metal mold. The master metal mold of course must be built with the same care, skill, labor and expense of the metal molds in general and the metal mold used in the prior art for producing encapsulated parts directly. However, one such master mold can make virtually an unlimited number of plastic plates which in turn are subsequently used in the abovementioned throwaway or disposable fashion to in turn produce enormous quantities of encapsulated devices. Hence, this again is a contributing factor to the substantial advantages of the present invention.

The plastic sandwich plates of the present invention are used in mating pairs wherein each plate in the pair has a portion of the cavity. There are multiple cavities in the plate. The pairs of plates are permissibly stacked on atop another wherein the same force of the molding press can be transmitted repetitively and simultaneously to the pairs of plates. This results in the use of a smaller molding press for a given quantity of encapsulated devices compared to the prior art technique using metal plates wherein a greater number of devices can be formed only by spreading out the molding plate whereby the press must be enlarged.

The sandwich plates are permissibly used in addition to the actual molding operation for supporting the bare unencapsulated delicate devices outside the press and then transporting the devices to the press before encapsulation, and from the press after encapsulation. Thus, the plates can permissibly be used to transport the unmolded frame through prior operations such as die and wire bonding as well.

The relatively light weight of the plastic plates permits such ready transport.

The plastic plates themselves are relatively thin, since the present invention uses the concept of flexibility in mold plates, as opposed to the rigidity of the prior art. The flexibility of the mold plates permits the plates to yield and readily mate to effect complete closure about the encapsulated device in the area of the mold cavity, so that no undesired resin bleed results. Seal inserts or coring can be molded onto the plastic plate, hence keeping plastic from forming in the area from the plastic body to the lead frame tie bar. Hence, the present invention utilizes to great advantage what was believed to be a disability in the prior art, namely, an absence of great strength in the mold.

The present plastic plates can be molded to the exact configuration desired including very delicate and precise detail in the area of the junction of the leads to the encapsulation. As also referred to above, it is prohibitively expensive and in some instances impossible to build the present metal molds to achieve such perfect fit in the area of the leads emerging from the encapsulation. However, with the plastic plates, one can spend what is necessary in the master metal mold to achieve whatever configuration is desired in the plastic plates since, as explained, these plastic plates are produced in great quantities to in turn produce the encapsulated devices.

The above advantages as well as others will become apparent in the further description of the invention.

BRIEF DESCRIPTION OF THE DRAWINGS

For purposes of illustrating the prior art, and a preferred form of the present invention, the accompanying drawings include:

FIG. 1a is directed to prior art, and is a plan view of an existing type of metal lead frame having portions thereof overlaid with circuitry, and adapted for placement into a mold for subsequent encapsulation in a plastic material;

FIG. 1b is a side elevational view of the metal lead frame of FIG. 1 and disclosing relative thickness in comparison with the overall size;

FIG. 1c is a plan view similar to FIG. 1a, in which certain areas of the metal lead frame have the electronic components and certain desired circuitry, encapsulated in plastic;

FIG. 1d is a side elevational view of the device of FIG. 1c disclosing spaced and generally rectangular-shaped encapsulated portions extending above and below the metal lead frame;

FIG. 1e is a transverse sectional view or end elevational view taken on the line 1e—1e of FIG. 1d;

FIG. 2 is a perspective view of a typical IC device after being processed from the metal lead frame, with metal leads of the IC unit being operatively bent and positioned for ultimate use;

FIG. 3 is an exploded perspective view of a typical existing mold assembly disclosing in detail the complexity of construction and formation of parts thereof, with particular emphasis being directed to mold inserts therein and mating structure;

FIG. 4 is an exploded, perspective, and pictorial view of the mold forming assembly of the present invention.

FIG. 5 is an enlarged, fragmentary plan view of that portion of an upper mold plate in accordance with the invention, in the area designated by broken lines in the lower left-hand corner thereof in FIG. 4;

FIG. 6 is a transverse sectional view through a cavity of the upper mold cavity plate taken on line 6—6 of FIG. 5 and showing details of the upper cavity and relative plate thickness;

FIG. 7 is an enlarged, fragmentary plan view of a portion of the lower mold plate, indicated by broken lines and designated FIG. 7 in FIG. 4;

FIG. 8 is a transverse sectional view taken on line 8—8 of FIG. 7, showing details of the lower cavities and recessing for the lead frame as also indexing means to facilitate assembly;

FIG. 9 is a perspective pictorial view disclosing upper and lower mold frame portions in accordance with the invention, the lower mold frame constituting a receiver for a plastic mold cavity module and runner plate;

FIG. 11 is a plan view of a lower mold frame assembly loaded with mold cavity modules and runner plates, taken on line 11—11 of FIG. 10;

FIG. 12 is a fragmentary, enlarged sectional view taken on line 12—12 of FIG. 11, showing mold modules and associated runner plates in great detail;

DETAILED DESCRIPTION OF THE DRAWING

Figure 10:
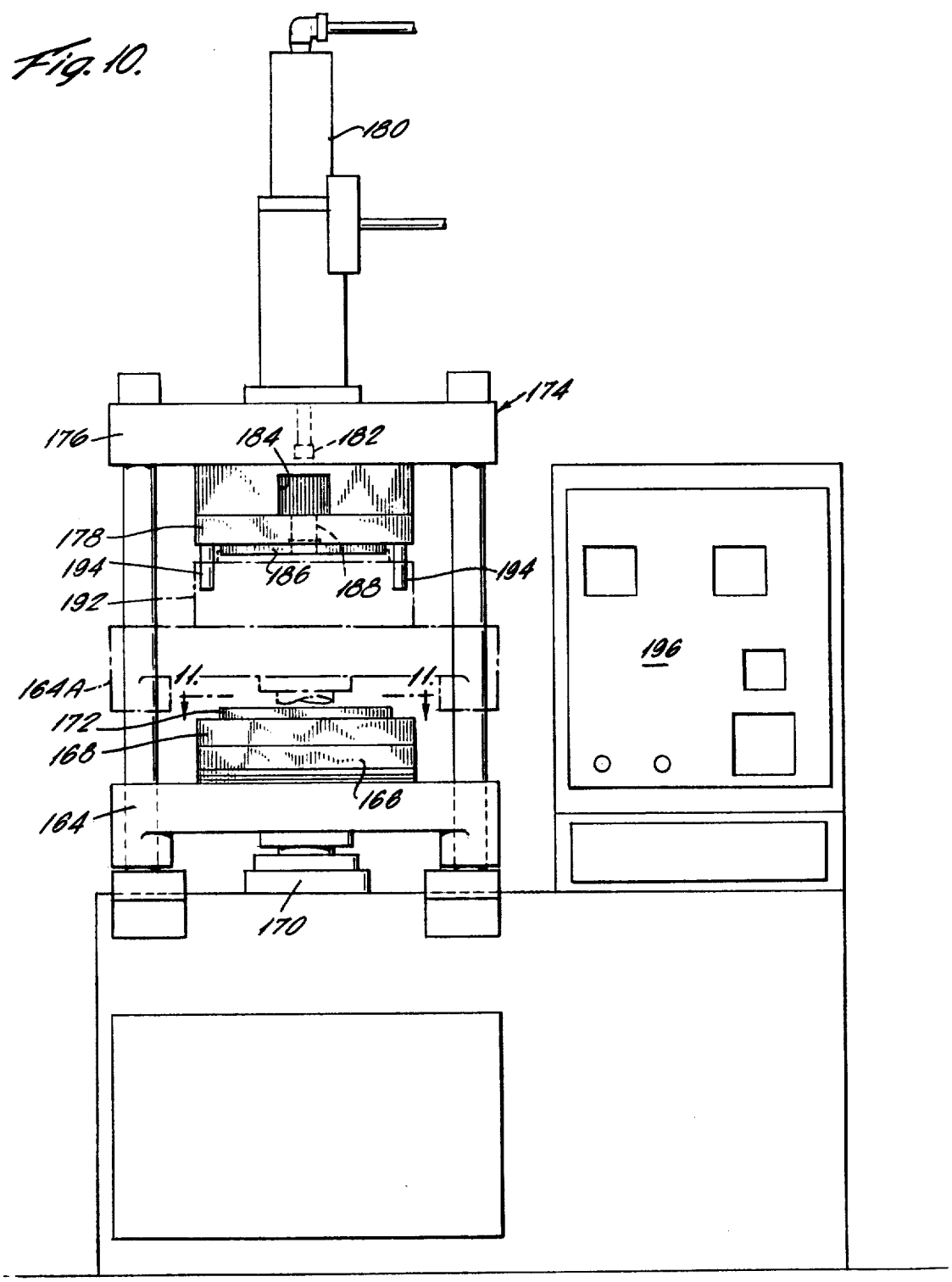
FIG. 10 schematically shows a conventional hydraulic press incorporating the lower mold frame of FIG. 9 as secured to the movable lower platen of the press and the upper stationary platen holding the upper mold frame.

FIGS. 1a, 1b, 1c, 1d 1e and 2 relate to the prior art product.

FIG. 3 shows, in exploded perspective, a prior art mold.

FIG. 1a discloses a metal lead frame generally designated 20 of an existing and well known type. This lead frame includes portions of an overlaid circuitry generally indicated at 22, and, again, of a known nature. Such a circuitry normally involves a device on a paddle 24, on which a multiplicity of circuit elements are incorporated in a known manner. The device is mounted on the surface of the paddle 24, and the remainder of the circuitry relates to leads for incorporation of this into an overall circuit of a machine or the like. This metal lead frame includes terminal segments as well as both the forward and end portions of such a frame.

In practice, this lead frame is placed into a mold of the character shown in FIG. 3 and those areas containing the electronic device, including leads, are encapsulated in plastic in the encapsulating process. It is to be noted in connection with FIG. 1a that this is a particular type of metal lead and can be similar to one used in the present process. The devices, as broadly indicated at 26, 28, 30 and 32, in fact disclosing only those portions of the metal lead frame which are later to be encapsulated in part to form encapsulated integrated circuits, are shown in this figure. It will be noted that those portions which are to constitute integrated circuits, when encapsulated at a later time, are staggered in respect to their electrical leads. This is apparent from the electrical leads 34, 36, shown in the left-hand portion of this figure. Most of the presently utilized apparatus have the leads connected end-to-end rather than being staggered and this, of course, places the relative components, or integrated circuits, farther apart. This concept of the invention provides a more compact design which is desirable. The relative small thickness of the metal lead frame 20 can be seen from FIG. 1b. The metal lead frame is provided with index holes at 38, which serve for orientation in a mold apparatus. These metal lead frames are very thin and small. By the same token, the device, very broadly designated at 22, on a paddle 24, is diminutive and consists of extremely fine portions subject to easy fracture or destruction and must be protected, not only during encapsulation, but the encapsulation is utilized to protect such circuitry when in use in electrical or electronic apparatus or components.

The staggering of the connecting leads 34, 36 is more clearly shown in FIG. 1c, which shows a metal lead frame such as in FIG. 1a, with certain areas or portions of the metal lead frame having the electronic components encapsulated in plastic, as indicated at 42, 44, 46 and 48.

In FIG. 1d, the encapsulated electronic components are shown in side elevation or cross section, and it will be seen that they have a generally rectangular, or truncated conical configuration. The relative staggering, resulting from the staggered leads, is also shown in FIG. 1c, as regards the encapsulated components 42–48.

FIG. 1e shows an end elevation of one of the components when taken along the line 1e—1e of FIG. 1d. The metal lead frame 20 has thereon the encapsulated device 42 and the leads are indicated at 36 etc. In FIG. 2, there is shown a single encapsulated IC device again designated generally as 42. The plastic encapsulating material being indicated at 42A and along each side of the IC, there being seven contact leads, so that it is a fourteen contact lead component and the individual contact leads have been bent at a right angled configuration for later incorporation in an electronic circuit or the like. All of this is well known in the art. It is also known that subsequent to such encapsulation, the lead frames are broken or cut by a machine into individual IC components, as shown in FIG. 2.

FIG. 3 shows, in exploded perspective, a portion of a typical mold assembly required for encapsulation of IC's on an in-line metal lead frame. The construction here shown is one known in the art and will be described only broadly, as to its components and function. It includes, generally speaking, an upper mold assembly 45, which has an upper mold frame mounting plate 47 and mounted thereto, an upper mold frame 50. An end cap upper mold frame 52 is at one end of the apparatus, constituting the upper mold cavities shown at 54, and an upper mold center block 56, having an opening for the upper mold plastic slug insertion tube 58 is incorporated. Beneath this portion in the assembly is the lower mold center block 60, having a lower mold pot 62 and a plurality of radiating runners 64. The lower mold assembly is generally designated at 66 and includes the usual chases, cavity and runner inserts. Broadly, the lower mold cavities are indicated at 68 and total, for instance, ten in number. An assembly block 70 includes a runner through 72, which extends longitudinally thereof and is additionally provided with the usual gates at 74. This lower mold assembly is adapted for mounting on lower mold framing member 76, which in turn is mounted by lower mold frame mounting plate 78. The lower mold framing member 76, in effect, constitutes the base of the mold assembly or frame. This latter base is provided with a plurality of ejection pin apertures 80 for ultimate coaction with ejection pins 82, which serve to eject the various components after the molding or encapsulation of the lead frames and circuit portions.

An end cap 84 is provided for the lower mold frame as shown. The ejection pins are mounted on an ejection pin mounting plate 86. An ejection pin actuating block 88 is positioned by ejection index limit pin 90. The lower mold is provided with assembly side parallel members 92, which are mounted on a thermal insulating plate 94. Plate 94 sits on the lower press platen and the mold assembly rests on the top thereof. Such a mold for instance has a capacity to produce eighty encapsulated devices in one molding operation. An alignment pin hole 98 is provided in the lower frame as shown.

FIG. 3 clearly shows that a typical mold assembly, including the lower portion and the upper mold assembly, will be difficult to manufacture and will require great skill to form the individual mating portions and the cavities for the lead frame, runners, gates, mold cavities, etc. This requires highly skilled tool and die makers. Furthermore, the mechanism is complex in that is uses a base plate and parallel side plates, a spring biased movable ejection pin base, ejection pins, a main block or body portion and, upon the latter, are the base of the mold assembly and the mold inserts having the left and right cavities. Furthermore, a runner block having sprue connectors from the runners is included so that the cavities can be filled. The center block contains the pot and runners radiating from it to allow the transfer, or encapsulating plastic medium under pressure, to flow into the runner assembly. Each and every portion utilized in this construction must be very carefully machined, and ground and then coated to permit separation, and is well known to be subject to wear and breakage. This is an extremely expensive and time-consuming apparatus to manufacture.

PRESENT INVENTION

The present invention is directed to a very substantial improvement in components of the machines of this type and, primarily, where the "plates" can be made of plastic, machined, or as possible, to be injection molded and disposable. It is now also possible, as will be seen hereinafter, to stack the plates and runner plates in the nature of sandwiches, so that a much greater number of IC's can be provided in one operational phase of the apparatus.

The present invention includes the use of an assembly fixture or carrier in pre-mold and post-mold operations, as a means to mechanize and automate the assembly and molding process and, thereby, very substantially reduce the cost of assembly and molding as well as reduction in cost of molding equipment. More generally speaking, and referring to FIG. 4, there is disclosed what might be referred to as a "module" of the present invention, generally designated 100. This includes an upper mold plate, or carrier half 102, formed from a suitable plastic, as also a similar lower mold plate or carrier 104. Each of these carriers or plates includes a plurality of cavities. Plate or carrier 102 has a plurality of spaced cavities 106, and lower cavities 108 are in the lower carrier. Additionally, the upper carrier includes index holes 110 for coation with index pins 112 on the lower carrier. It will be noted that the carrier plates consist of thin plastic plates, each having two parallel rows of the cavities. Opposed cavities are interconnected by shallow troughs, shown at 114.

The inner face of the lower carrier is provided with formed pocket 116 of a shape conformed to the lead frame geometry, so that a metal lead frame 118 can be placed therein as is visually recognizable from FIG. 4. These metal lead frames 118 have index means, generally designated 120, for coation with the index pins 112, designated in lower carrier plate 104. This permits appropriate orientation of the metal lead frame in the pocket 116. It is also to be noted that the cavities 106, 108 are so formed as to provide, in the end encapsulated product, the upper and lower truncated conical sides of the rectangular shape encapsulated IC device.

Particulars of the configuration of the cavities and the upper carrier can be seen from FIGS. 5 and 6, for example. Here, the upper carrier is shown as including a plurality of the cavities 106 with the tapered edges shown by dotted lines at 126 for the ultimate formation of the encapsulation. The shallow troughs 114, interconnecting the cavities are also shown in FIG. 5 and are of an obvious nature.

It will thus be seen that the upper and lower mold cavity plates have indexing means, and the metal lead frames can be dropped in place within the lower mold plate or carrier. The entire assembly is of very thin and compact structure, and conjointly form a compact mold moldule 100, having the lower carrier plate, metal lead frames therewithin and the upper mold carrier plate. Directly below the lower mold cavity plate or carrier 104, there is positioned a metal runner plate 128 having a runner trough 130 extending longitudinally thereof. The runner plate is a relatively thick metal plate and the trough extends from one end along the entire length to allow the transfer medium, i.e. plastic, to flow directly down the middle or center between the two rows of cavities. This trough, when filled with liquid transfer encapsulating plastic, permits the same to flow down the trough, and to the left and right of center through the gate tracks to fill cavities of coacting modules.

FIG. 7 is comparable to FIG. 5, but shows that portion indicated by broken lines and designated FIG. 7 in FIG. 4. It will additionally be seen from an inspection of FIGS. 7 and 8 that a plurality of nibbles 132 are provided in the lower mold plate or carrier 104 and these pockets conform to the metal lead frame shape.

Functionally, the combination of the lower and upper mold cavities can be readily used for molding of the plastic about the metal lead frame, the lead frame having the desired device already attached therein. It is obvious that the embossed configuration of the nibbles 132, conforming to the geometry of the metal lead frame, would be most difficult to machine in a standard or conventional type of mold, as shown in the prior art type. With the prior art type, this would require for example etching or engraving. The present invention permits the injection molding about a completed IC, or similar model, to thereby so form the various cavities and recessed portions in the upper and lower plates. After such a formation, it is possible to disassemble or part the different sections of the mold, and the various pockets, etc. of the intricate pattern as so formed will enable a new metal lead frame to sit down flush to the surface of the lower mold cavity plate and enable a more careful molding and encapsulation of a new IC and the like. This will also serve to reduce the amount of flash material around its border which would otherwise be undesirable, and possibly create a damming effect. The lower mold plate can be made to accept the metal lead frame in a very tight, close-fitting and designed manner.

FIG. 9 discloses more details of a molding apparatus or press which utilizes the present invention. An upper mold assembly block 134 is provided, having a runner trough 136 in the lower surface thereof. Again, a center tube 138 for plastic plus insertion is provided. A lower mold frame mounting block 140 is spaced below the upper block and is provided with indexing ports 142. Mounted on the lower mold frame mounting block 140 is a lower mold frame 144 and a mold frame cap 146 at the ends. Slots 148 are provided peripherally spaced about lower mold frame 144 to permit module removal by use of appropriate utensils. A lower mold center block 150 is positioned within the mold frame 144 and includes a pot 152 from which extend longitudinal runner troughs 154. A metal runner plate 156 is positioned above plastic mold module $M_1$ 134 and is adapted for mating with the runner troughs 154 for dissemination of the liquid plastic encapsulating material. This metal plate 156 has a runner trough 158 formed therein. As seen in FIG. 9, a plastic mold sandwich, or module, $M_1$ is placable between the runner plate 156 and the lower mold frame. This mold sandwich or module $M_1$ consists of two carriers or plates 160, 162, corresponding to the members 102, 104 in FIG. 4. Interposed between the carriers will be a metal lead, for formation of the encapsulations about the circuitry thereof. It will be seen that the present invention includes, accordingly, upper and lower mold frames, the lower mold frame being a receiver for a plastic mold cavity module and runner plate. It is much more simple is design and construction as compared to the intricate mold assembly of the prior art as shown in FIG. 3. Additionally, it will be noted that much complexity has been removed as regards the two constructions. The present device includes no pin ejectors and springs, nor pin ejector plates and mounting plates. It is an entirely simplified construction and, in effect, constitutes a well upon which the modules and the runner plates can be placed and held captive while the transfer molding occurs.

As illustrated in FIG. 9, a module is being placed or dropped within the left-hand portion of the lower mold frame assembly. Atop that module is the metal runner plate and atop hat is another module; atop that module could again be another runner plate; and atop that metal runner plate could be a third module, so that the lower mold frame assembly is, in effect, designed to hold three module assemblies to the left of center, and three module assemblies to the right of center. This provides for 120 IC molded encapsulated components. There is a substantial increase in volume of encapsulated parts which can be made in the apparatus of the present device, and this is apparent when compared with the very limited number of lead frames and metal parts that can be encapsulated in the intricate device shown in the prior art of FIG. 3, which, when illustrated will only accept 80 components, whereas the 120 components are possible in the frame of FIG. 9. The lower mold frame portion in FIG. 9 is mounted to the hydraulic press movable platen shown in FIG. 10.

The standard hydraulic press used is similar to that for the conventional mold of FIG. 3. As shown, the lower platen 164 is, as usual, capable of elevating and closing the press. The lowered position is shown in full lines supporting parallels 166 for mounting lower mold assembly 168. A lower platen elevating and closing ram 170 serves the usual function of elevating the lower press platen to the upper position, designated in broken lines and referred to as 164A. The mold frame for the plastic modules is shown at 172. The hydraulic press, as shown in FIG. 10, is generally indicated at 174, and includes upper platen 176. An upper mold assembly 178 is provided, and operationally mounted thereabove is a ram 180 which, in this instance, is capable of asserting tons of pressure upon material, such as a preform of plastic material for melting and forcing the plastic slug transfer molding material into the mold cavities. A ram 182 serves for compressing the plastic slug as thus formed. A port 184 is shown for the plastic slug insertion into the upper mold assembly 178 which carries therebelow upper mold block 186. A slug drop tube 188 is operatively interconnected to pot such as 152 shown in FIG. 9.

The lower mold assembly is shown at dotted lines at 192 with the aforementioned index pins 194 for proper orientation and correlation of the various parts. It will be noted that the lower mold assembly shown in dot and dash lines at 192 and the elevated lower platen 164A are shown in mated closing positions upon actuation or elevation of the lower platen elevating and closing ram. A usual control panel assembly is very broadly designated at 196.

Functionally referring to FIG. 10, the lower mold assembly is mounted to the lower movable ram-actuated platen and the upper mold assembly of FIG. 9 is mounted stationary to the upper platen. The upper platen directly above the upper mold frame shows a port and some of the supporting structure. The port is used for the placement of a cylindrically-shaped charge of transfer material for ultimate encapsulation of the IC. When the molds have been filled, the lower mold has been filled to the left and right of center with the modules and the runner plates, then the lower platen is raised and the mold is closed. A charge is put in the port directly above the uppermost mold frame assembly and dropped down the centrally located tube or sleeve. When the upper ram is actuated and applies pressure to the cylindrically-shaped solid charge of plastic, it is melted under the terrific heat and pressure and caused to flow as a fluid through the various troughs of the runner plates and then cross-sectionally into and through the smaller, narrow troughs, connecting troughs in the upper mold plates into the cavities and entirely surrounding the IC's in this area.

FIG. 11, which is a plan view on a large scale looking down upon the lower mold frame assembly, referring to the uppermost level to the left and right of center that contains the modules. This is taken on 11—11 of FIG. 10. The center block portion 150 of the lower mold assembly has a shallow, cup-like depression 152 with small or little troughs 154 emanating to the right and left therefrom. When the transfer plastic under heat and pressure begins to flow, it will flow to the left and right through these troughs, directly across the upper plates of the modules and then crosswise into the cavities forming the encapsulated IC's.

In FIG. 12, which discloses a fragmentary, enlarged sectional view taken on line 12—12 of FIG. 11, a stacked or multiple configuration is shown. This is the so-called sandwich used for the machine. The lower mold frame mounting block 140 again supports the lower mold frame 144. The lower mold frame is provided with frame cap 146 and centrally mounts the lower mold assembly center block 150. A plurality of modules indicated by arrows on the left-hand side of the figure and respectively designated $M_1$, $M_2$, and $M_3$ are shown. Each of these modules is coactively positioned with runner plates, referring to the right-hand end of the figure and the runner plates being respectively designated 156A, 156B. Mold cavities 106 are provided in each of the modules and the runner troughs 158A, 158B and 154 are again provided. The plastic slug insertion tube is actively mounted on upper mold assembly block 186 and within the opening formed in upper mold assembly mounting plate 178. A plastic slug of the transfer or encapsulating medium is shown at 204, actively engaged by the hydraulic press upper ram head 182, generally as shown in FIG. 10. The particular arrangement of this sandwich-like array, includes a plurality of the members as specifically shown in the exploded view of FIG. 4 and placed in the mold as generally shown in FIG. 9. FIG. 12 discloses how the plural metal runner plates form the necessary troughs from the cup-like portion 192 in the center and that allows the transfer fluid to flow centrally down these troughs on each layer. The right-hand side of the figure discloses the pockets to which the encapsulating transfer medium will flow, into and through and forming the desired encapsulating shaped area on the lead frames mounted between the stacked upper and lower plates or carriers 102, 104 referring to FIG. 4.

Figure 13:
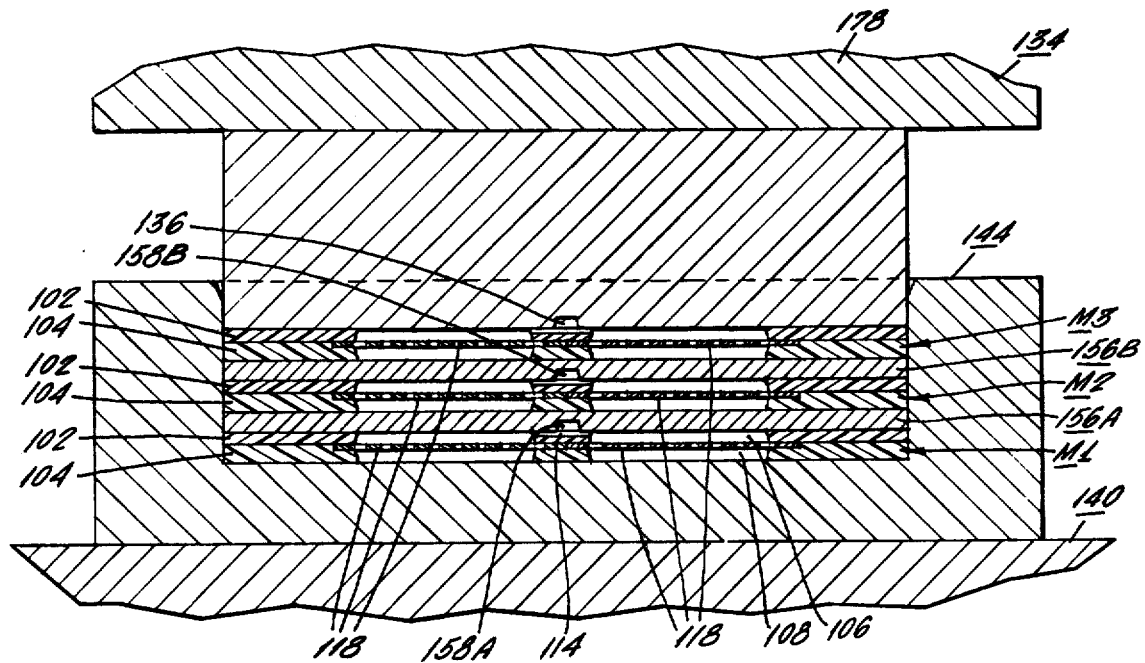
FIG. 13 is an enlarged, transverse, sectional view taken on line 13—13 of FIG. 12.

FIG. 13, which is a transverse, sectional elevational view taken on line 13—13 of FIG. 12, shows some of the details of this stacked module arrangement. The lower mold frame mounting plate 140 mounts the lower mold frame 144 and placed therein, as generally shown in FIG. 12, are the plurality of modules $M_1$, $M_2$ and $M_3$, referring to the left-hand side of the figure. Each of the modules includes a plastic lower mold plate or carrier 104 and an upper carrier plate 102. A metal lead frame 118 is again included between the two carrier plates in operative position as previously described. The metal runner plates 156A and 156B are superposed on the lower modules and the runner troughs 158A actively cooperating with gate tracks 114 permit the necessary distribution of the encapsulating plastic transfer medium which operatively flows through the upper mold block assembly 134 operatively positioned below upper mold assembly mounting plate 178. This view shows in detail, starting at the lower level, a module holding metal lead frames to the left and right and the cavities for each lead frame. The very shallow gate or trough interconnecting the two cavities is shown, and directly thereabove, runner plates having the trapezoidal-shaped troughs 158A. Above this lower runner plate there is another module of the same construction, above this module, another runner plate of the same configuration and above the runner plate, an additional module. Then, under compression and bearing down on this is the upper mold assembly, which has, running from left and right, a trough such as that described with the runner plates to allow the upper module to be fed with the transfer encapsulating medium through its trough.

Figure 14:
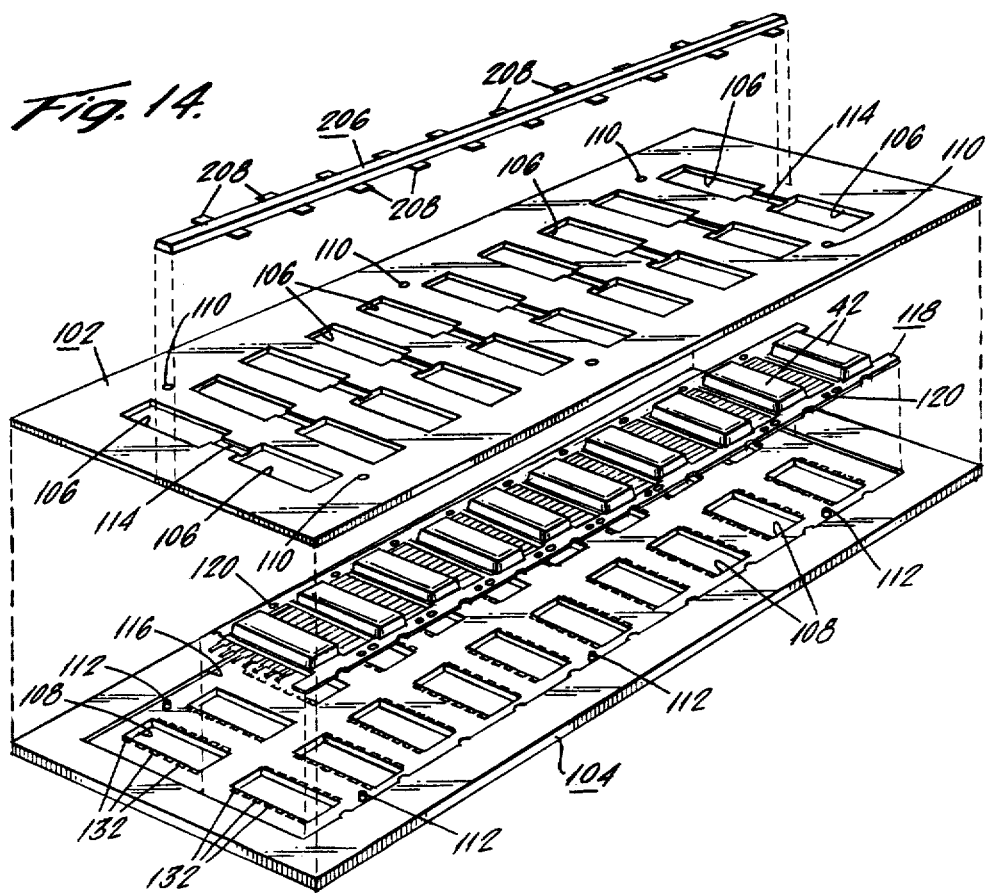
FIG. 14 is an exploded, perspective, and pictorial view of a mold cavity module, following a transfer molding encapsulating process and disclosing individual components of the finished molded or encapsulated components in partially separated condition from the mold.

FIG. 14 is a perspective pictorial view showing in an exploded array, the various members in which the encapsulated portions are formed on the metal lead frame and this view shows the relative condition after the transfer molding or encapsulation has occurred. The modules M and the runner plates are removed from the lower mold assembly. The lower plastic mold plate or carrier 104 is shown separated from the upper mold plate or carrier 102. The various portions of these carriers or plates are designated as above described with particular reference to FIG. 4. It will be seen that the metal lead frame 118 has formed thereon a plurality of encapsulated IC's 42, all of these being still associated with the overall lead frame as it was initially placed in the cavity therefor formed in the lower plastic mold plate or carrier 104. This assembly, however, is now removed and a runner sprue generally indicated at 206 and which has been formed in the molding process in the runner cavities and gates, is removed and broken away from the upper plate. Sprue stubs 208 which are connected with the sprue 206 during the molding process are shown. This sprue is shown in FIG. 14 as broken away from the upper plate or carrier and subsequently the upper plate is removed. The lead frames, with their areas of encapsulation of the electronic components, are now free and can be removed from the lower mold plate or carrier. The encapsulated IC's now need only be separated and the individual leads bent to the appropriate shape as shown at 36 in FIG. 2.

The mold cavity modules can be reused in a successive molding of additional IC's. If, however, the mold cavity module, primarily the carrier plates, are damaged or worn, the material thereof can be broken up, ground or pulverized and then remolded to form new plates or molds such as, for example, by injection molding as above referred to, or similar processing. The plastic material used in forming the carrier plates with their cavities can, particularly through an injection process, be reused by forming new mold plates. This is a substantial improvement over the previously known and used, meticulously machined forming plates as in the prior art and as above described in detail with reference to the initial figures of the drawings.

While the system, apparatus and process constituting the invention will be readily apparent from the foregoing, a brief summarization of the overall concept will be of value. The invention and technique is usable to transfer mold a plastic protective and strengthening body around electronic components which are assembled on metal lead frames. The system, however, could be used in different molding technologies and utilizing different molding materials. The system is not limited to molding or encapsulating electronic components on lead frames.

Of significance is the use of the carrier plate in the system which is formed of a plastic material readily by, for example, injection molding and eliminating the requirement or necessity of precise machining, etching, and the like, and the carrier can be used in pre- and post-molding operations as an aid to mechanization or automation of operations. The use of the carrier as an assembly fixture portion substantially reduces cost of assembly and molding as well as the cost of the molding equipment. The carirer plates, as assembled into so-called modules containing the lead frames, are used throughout the assembly process and encapsulation of the electronic components. The carriers can be used singularly, or as multiples lying on the same plane, or stacked on top of one another, in a machine which introduces the liquid plastic to each required area for encapsulation of the electronic component or other item, the encapsulation being dense and a void-free package in the absence of damage to a delicate subassembly. These carrier plates provide protection to lead frames and contribute to significant handling ability of the lead frame during pre-molding, molding and post-molding operations. The various operations have been set forth hereinabove in connection with the specific description of the individual figures of the drawings. Another advantage to the plastic carrier and premolded seal coring is that in the case of a lead frame of the non-interdigited design, it is possible to eliminate the interconnecting tie bar and hence the expensive postmolding mechanical stamping operation to remove the metal bar.

Subsequent to the molding function, additional steps such as post-curing can take place with the carriers being placed, for example, directly into post-mold curing ovens. Subsequent to the molding and/or post-curing, sprue removal, batch marking, testing, some deflashing operations and formings can be done to the lead frames while still in the carrier, the carrier being subject to automatic handling into and through the operations. The lead frames are finally removed from the carriers and presented to a singulation system where the individual encapsulated IC's are cut out (singulated) and loaded into a different magazine for further processing and shipping.

Other advantages and contributions have been set forth hereinabove. Of substantial significance, of course, is the reduced mold cost, the smaller quantity of costly molding compound used due to higher cavity density permitted by means of use of the carriers, and the press tonnage, per se, is reduced. Handling costs, material consumption and lower mold and molding costs with increased molding production result. Component damage is reduced, thereby increasing effective yields and effecting savings in steps of pre- and post-molding.

The system, apparatus and process with the inclusive advantages of the present invention, will be readily understood from the foregoing description of a preferred embodiment when taken together with the drawings.

Many other possible variations in specifics of components or details of the invention will be apparent to those skilled in the art. While in the present disclosure, there is shown a preferred embodiment of the invention, some possible modifications have been broadly referred to and it is to be understood that the invention is capable of additional changes or modifications without departing from the spirit and the scope of the inventive concept as expressed herein and as defined and limited solely by the accompanying claims.

We claim:

1. A system for encapsulating electronic components with a protective insulating plastic including a press with upper and lower coactive press assemblies, at least one plastic molding module operatively situate between said assemblies, said module including upper and lower flat carrier plates, each having a partial electronic component and liquid plastic encapsulating material cavity therein, and adapted upon reverse cavity position juxtapositioned to form a total encapsulating cavity, said carrier plates consisting of premolded, cast and shaped plastic material, means for introducing a hardenable liquid plastic material to said total cavity having an electric component therein to surround said component and provide a hardened dimensionally accurate body of plastic around said electronic component, (to thereby constitute) said plates and said encapsulated component constituting a removable unit as a dense, void free package in the absence of damage to a preassembled electronic component and with extraneous hardened plastic material being subsequently separable from said encapsulated component.

2. A system as claimed in claim 1, said electronic component comprising an IC assembled to metal lead frames, said total cavity operatively enclosing said IC and portions of leads connected thereto during an encapsulating operation phase of the system, with predetermined areas of said lead frames remaining exposed.

3. A system as claimed in claim 2, said carrier plates having a plurality of spaced cavities therein, each adapted for encapsulating containment of an IC and assembled metal lead frames.

4. A system as claimed in claim 3, wherein adjacent ones of said cavities are transversely positionally staggered whereby ICs therein and leads in said lead frames assembled thereto can be positionally interposed and arranged to spatially diminish overall length of multiple cavity carrier plates.

5. A system as claimed in claim 4, including a plurality of modules in a stacked array, each including said plural cavities, and liquid plastic introducing means to each said cavity.

6. In a system as claimed in claim 5, said plates forming said modules each having a plurality of spaced half cavities therein and adapted upon coaction to form a plurality of electronic component holding cavities, and with liquid plastic material troughs so disposed as to flow liquid plastic material into each said cavity.

7. In a system as claimed in claim 6, each said half cavity having, in transverse cross section, a truncated conical configuration whereby, upon mating of respective ones of said half cavities, the formed molding cavities therebetween is of, in transverse section, a double truncated conical configuration with the greatest thickness being at the center line thereof.

8. In a system as claimed in claim 7, said electronic components each comprising a stamped metal lead frame including, respectively, a semiconductor chip and electronic circuitry thereon, a plurality of connecting leads in said metal lead frame operatively interconnected to and with said circuitry mounted on said chip and extending outwardly therefrom, the lower ones of said mold forming plates having a top recess therein, said metal lead frame being positioned in partially confined relationship in said recess, the positionally staggered relationship of said half cavities corresponding with substantially identically positionally staggered combinations of said chips with circuitry thereon and the multiple connecting leads therefrom, whereby said connecting leads from adjacent encapsulated components are spacedly positionally interposed with respect to one another, and thereby permitting closer longitudinal spacing between said molding cavities and the ultimate encapsulated electronic components.

9. In a system as claimed in claim 8, each said module being individual and separably movable into and out of operative positionment within said lower mold assembly, with each module including a said lead frame interposed between said plates of each superposed set thereof, said modules, following encapsulation of said lead frames and electronic components, being individually separably removable for subsequent runner sprue and extraneous hardened plastic removal, and singularization of the respective encapsulated electronic components.

10. In a system as claimed in claim 8, said upper mold assembly including an upper mold assembly block, a plastic material slug insertion tube extending through said assembly block and being in operative coactive positionment with said pot in said lower mold center block.

11. In a system as claimed in claim 10, and wherein the liquid molding encapsulating plastic material consists of a polymerizable plastic which, upon hardening through polymerization, consists of an inert material absent electronic or atomic affectable materials therein, being pure, and absent voids therein.

12. In a system as claimed in claim 11, said molding material being liquefiable solely through extreme pressure and heat upon actuation of said press to a closed operative molding condition.

13. In a system as claimed in claim 12, wherein the plastic material of said upper and lower mold forming plates is of a thermoplastic material, said material and extraneous materials removed from the finished and encapsulated electronic components being reusable by plasticizing with heat.

* * * * *